(12) United States Patent
Ferrant

(10) Patent No.: US 6,373,741 B2
(45) Date of Patent: *Apr. 16, 2002

(54) MEMORY CIRCUIT ARCHITECTURE

(75) Inventor: Richard Ferrant, Saint Ismier (FR)

(73) Assignee: STMicroelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/396,617

(22) Filed: Sep. 15, 1999

(30) Foreign Application Priority Data

Sep. 16, 1998 (FR) .............................. 98 11715

(51) Int. Cl.$^7$ ................................. G11C 5/06
(52) U.S. Cl. ................... 365/63; 365/230.06
(58) Field of Search ................ 365/63, 149, 207, 365/230.03, 230.06

(56) References Cited

U.S. PATENT DOCUMENTS

| | | | |
|---|---|---|---|
| 5,097,440 A | 3/1992 | Konishi et al. ............... 365/51 |
| 5,361,223 A | 11/1994 | Inoue et al. .................. 365/51 |
| 5,499,215 A | 3/1996 | Hatta ...................... 365/230.03 |
| 5,838,604 A | * 11/1998 | Tsuboi et al. ................... 365/63 |
| 5,940,329 A | * 8/1999 | Seitsinger et al. ...... 365/189.05 |
| 5,949,732 A | * 9/1999 | Kirihata ................. 365/230.03 |
| 5,966,338 A | * 10/1999 | Liu et al. ..................... 365/207 |

FOREIGN PATENT DOCUMENTS

EP  0 771 006  5/1997

OTHER PUBLICATIONS

French Search Report from 98 11715, filed Sep. 16, 1998.

* cited by examiner

Primary Examiner—Richard Elms
Assistant Examiner—Anh Phung
(74) Attorney, Agent, or Firm—Wolf, Greenfield & Sacks, P.C.; James H. Morris

(57) ABSTRACT

An integrated circuit memory including an array of memory cells divided into several sections, and several rows of column decoding amplifiers, the respective outputs of which are interconnected, by column, by means of a decoded bit line, each decoded bit line including two perpendicular sections, one of which is in the row direction to directly connect each decoded bit line to an input of an input-output stage of the memory arranged at one end of the rows.

25 Claims, 4 Drawing Sheets

MEMORY CIRCUIT ARCHITECTURE

BACKGROUND OF THE INVENTION

1. Field of the Invention

The present invention relates to memories made in the form of an array network of memory cells in an integrated circuit. The present invention more specifically applies to DRAMs which store the data (states "0" or "1") to be stored in memory cells, each formed of a storage capacitor and of a selection MOS transistor. Reference will be made hereafter to the example of a DRAM. It should however be noted that the present invention also relates to other types of memories, for example, SRAMs or EPROMs and, more generally, any array of cells.

2. Discussion of the Related Art

FIG. 1 very schematically shows an example of a cell 1 of a conventional DRAM. Such a cell 1 is formed of a selection MOS transistor T (herein, for example, an N-channel transistor) associated with a data storage capacitor C. The gate g of transistor T is connected to a row WL, called a word line. Drain d of transistor T is connected to a column line LBL, called a local bit line. Source s of transistor T is connected to a first terminal of capacitor C, the other terminal of which is connected to a constant voltage Vp, generally a median voltage (Vdd/2) between high and low supply voltages Vdd and Vss (generally the ground). Terminal s forms the storage node for the data of the memory cell thus formed. Several memory cells shown in FIG. 1 are associated in an array of word lines and bit columns.

For a cell 1 such as shown in FIG. 1 to be addressed., the word line WL associated with the gate of transistor T has to be brought to a high voltage, generally high supply voltage Vdd of the array.

If this addressing is linked to a write operation, storage node s is then placed either at the low supply voltage (Vss) of the array if capacitor C is discharged via a bit line LBL connected to the ground, or at potential Vdd if bit line LBL is placed at potential Vdd, signifying a programming to the high state. To simplify the present discussion, the levels described hereabove do not take account of the influence of threshold voltage Vt of transistor T upon the level stored in capacitor C.

If cell 1 is addressed in the read mode, local bit line LBL is precharged to a median potential (Vdd/2) between the two high and low supply potentials Vdd and Vss of the circuit. The stored state "0" or "1" is then determined by comparing the potential of bit line LBL, modified according to the charge of capacitor C, with a reference bit line, also precharged to a level Vdd/2 but not influenced by the storage capacitor.

FIG. 2 very schematically illustrates the use of reference bit lines in a so-called "open" DRAM, in which the reference lines come from a neighboring array of memory cells, distinct from the array containing the addressed cell, as opposed to "folded" memories where the reference line of an addressed cell is formed by the bit line neighboring this cell. The present invention however also applies to folded memories as will be seen hereafter.

In such a memory architecture, a first plane or section P1 of cells 1 of the type shown in FIG. 1 is separated from a second memory plane P2 containing the same type of elementary cells 1'. Each plane P1, P2 forms by itself an array of memory cells independent from the other, in that it is addressable by different word lines WL1, WL2. On the bit line side, each memory plane has its own local bit lines LBL1 and LBL2, but shares the read/write or column decoding amplifiers (not shown in FIG. 2) with the other memory plane. Hereafter, reference will be made to a read amplifier or column decoder. In practice, each local bit line $LBL1_j$ or $LBL2_j$ of each memory plane P1, P2, is connected, via a section selection transistor $Ts1_j$, $Ts2_j$, to a global bit line GBL1, GBL2, respectively. Global bit lines $GBL1_j$ and $GBL2_j$ corresponding to columns of the same row j in the two memory planes P1 and P2, they however share a same column decoding amplifier, one of the two lines being used as a reference by the other. Accordingly, memory planes P1 and P2 are not addressed simultaneously in the read mode (this is why they are respectively associated with different word lines), each plane being in turns used as a reference plane for the memory cells read in the other memory plane.

For simplification, memory planes P1 and P2 have not been completely shown in FIG. 2. Only one cell for each plane and the section decoding transistor associated with the corresponding local bit line have been shown. The rank of the word lines has been designated by index I while the rank of the bit lines has been designated by index j.

Section selection transistors $Ts1_j$ and $Ts2_j$ receive, on their respective gates, control signals Seg1 and Seg2 which are simultaneously activated.

Assuming a reading of cell 1 at the intersection of lines $WL1_I$ and $LBL1_j$, the selection transistor T of this cell is turned on, as well as the transistor $Ts1_j$ of selection of the section corresponding to memory plane P1. Global bit line $GBL2_j$ is then used as a reference bit line for the reading from cell 1 of plane 1, transistor $Ts2_j$ being also turned on to equalize the parasitic elements. The global bit lines are precharged to level Vdd/2 by means of precharge devices (not shown) connected, for the occasion, to first end terminals $PL1_j$, $PL2_j$ of lines $GBL1_j$, $GBL2_j$. This precharge may be performed via local bit lines (all transistors Ts being on along the column). Since both global bit lines are precharged to level Vdd/2, the direction of the slight difference (coming from capacitor C of the decoded cell) between their respective levels during the reading determines the state of cell 1.

It should be noted that signals Seg1 and Seg2 simultaneously control the section selection transistors Ts1 and Ts2 of all the local bit lines of the memory plane with which these control signals are associated. The column selection in the memory array is generally performed downstream, that is, at the level of the data input-output stages in the memory. These stages (not shown in FIG. 2) especially include buffers.

FIG. 3 very schematically shows a conventional example of the read amplifier or column decoder CDEC and of an input-output stage I/O of a memory to which the present invention relates.

Each pair of global bit lines $GBL1_j$, $GBL2_j$, associated to be respectively used by the other as a reference bit line, is sent onto one of the two inputs of a column decoding amplifier $A_j$, intended for providing, on an output $S_j$, the decoded state of the memory cell from which it has been read. Amplifier $A_j$ receives control and supply signals generally designated by reference $CTRL_j$. Output $S_j$ of amplifier $A_j$ is sent, with the respective outputs of several other read amplifiers (for example, $A_{j+1}$), onto an input-output stage $I/O_j$ for selecting one of the inputs that it receives to provide a single bit $B_j$ which has been read. Stage $I/O_j$ is controlled by a bit decoding circuit BDec, and is associated with several other input-output stages receiving output signals from different read amplifiers, each stage I/O providing a bit of a word (for example, of 16 bits) of the memory.

The bulk of a column decoding amplifier $A_j$ of a conventional DRAM generally leads to having these amplifiers aligned two by two in the column direction to have a sufficient width to ensure all the connections required by the transistors constitutive of these amplifiers. Thus, in FIG. 3, two amplifiers $A_j$ and $A_{j+1}$ have been shown to be aligned in the column direction (vertical direction in the drawing).

A problem which is raised in the making of DRAMs is the necessary compromise between the signal-to-noise ratio received by the column decoding amplifiers CDEC (FIG. 3) and the number of necessary section decoders SDEC (FIG. 2), and thus of memory planes P. Indeed, the higher the desired signal-to-noise ratio for the read amplifiers, the more the number of memory planes and, accordingly, the number of section decoder and read/write amplifiers, has to be increased.

It can be assumed that the signal-to-noise ratio variations are essentially due to the capacitors involved. Upon reading from a memory cell, two "stray" capacitances intervene in addition to capacitor C of the cell. These originate, on the one hand, from global bit line GBL on which local bit line LBL of the cell from which it has been read connects, and which generally has a capacitance on the order of 450 fF. A second stray capacitance comes from local bit line LBL of the involved cell and depends on the number of cells connected on transistor Ts of the corresponding section decoder. Conventionally, for 64 connected cells per section, this local bit line capacitance is on the order of 150 fF. The stray capacitances are to be compared with the capacitance of capacitor C of the cell which is, for example, on the order of 35 fF. Such a 35 fF capacitance corresponds to the capacitance of a DRAM cell made in HCMIOS6 technology and of a size corresponding to the minimum size which can be made in this type of technology. Indeed, the capacitance of capacitor C of the memory cell is linked to its size, which is desired to be as small as possible to minimize the size of integrated circuit memories.

Signal-to-noise ratios smaller than $\frac{1}{15}$ are thus frequent, which results in a need for very high performance amplifiers $A_j$ and, accordingly. for amplifiers including a relatively large number of transistors (on the order of some thirty transistors per amplifier).

Further, from a given threshold of the signal-to-noise ratio, and thus of the number of sections for a same amplifier, the memory has to be divided and the number of amplifiers must be multiplied.

To avoid further alteration of the signal-to-noise ratio, it is not conventionally desired to increase the number of cells per section.

However, a disadvantage of section decoders is that they are bulky and require control signals. Further, all section decoders have to be simultaneously controlled during the precharge of the global bit lines. Such a control results in a relatively strong current requirement with respect to the current required for the addressing of a word line. A consequence is the relatively long time taken at the level of a charge pump circuit to provide the sufficient current, unless said circuit is oversized, which adversely affects the memory size.

The space required to make the section decoders and the column decoding amplifiers determines, mainly with the bulk of the actual memory planes, the general bulk of the integrated circuit memory.

FIG. 4 very schematically illustrates the arrangement of the different elements constitutive of an integrated circuit DRAM of the type to which the present invention applies. The representation of FIG. 4 indicates the areas in which the different memory components are implanted on an integrated circuit chip 2.

For simplification, only six memory planes P1, P2, P3, P4, P5, P6 have been shown in FIG. 4. It should be noted that, in practice, the number of memory planes is much greater (on the order of 16, 32, and more). At one end of the word lines (not shown in FIG. 4) of each memory plane, a row decoder RDEC, associated with the memory plane involved, selects the addressed word line in the corresponding plane. The memory planes are associated two by two with a section decoder SDEC12, SDEC34, SDEC56 for selecting that of the memory planes, the local bit lines of which have to be used as a reference to read the other one. The global bit lines coming from the different section decoders are sent to the respective inputs of column decoding amplifiers CDEC, the respective outputs of which are sent to the inputs of input-output stages I/O.

The internal structure of the memory planes, of the section decoders, and of the input-output stages, as well as their operation, correspond to the above description of FIGS. 1 to 3. Row decoders RDEC are connected to a predecoder PREDEC receiving an address signal ADD over several bits. The input-output states I/O are connected to a data bus DATA over several bits and a control area CONTROL of the memory circuit receives control signals CTR. The control area is physically implanted in a corner of chip 2, left free after implantation of the other components, for example, in the lower left-hand corner of the chip, as illustrated in FIG. 4.

The memory planes and the section decoders altogether form what is generally called a memory array. The other circuits correspond to the decoding and input-output circuits of this array.

U.S. Pat. No. 5,499,215 discloses a memory in which column interconnection lines of sense amplifiers (SA) are connected by one end, to a column selection circuit (DA).

SUMMARY OF THE INVENTION

An object of the present invention is to provide a novel DRAM architecture which improves or optimizes the economy of space of the integrated circuit chip.

The present invention also aims at providing a DRAM which, for a given elementary memory cell size, has a reduced bulk with respect to conventional memories.

The present invention also aims at reducing or minimizing the current required for the memory operation, in particular, in the bit line precharge during a reading.

To achieve these and other objects, the present invention provides an integrated circuit memory including an array of memory cells divided into several sections, and several rows of column decoding amplifiers, the respective outputs of which are interconnected, by column, by means of a decoded bit line, each decoded bit line including two perpendicular parts, one of which is in the row direction to directly connect each decoded bit line to an input of an input-output stage of the memory arranged at one end of the rows.

According to an embodiment of the present invention, the direction change between the two parts is made without an active element, through a direct conductive interconnection.

According to an embodiment of the present invention, the memory includes one row of column decoding amplifiers for at most two sections.

According to an embodiment of the present invention, where each memory cell is formed of a transistor associated with a storage capacitor, each column decoding amplifier is directly connected to a local bit line interconnecting the respective drains of the transistors of the memory cells of a section.

According to an embodiment of the present invention, all the circuits of exploitation of the memory cells are housed in the same alignment on the integrated circuit.

According to an embodiment of the present invention, all the circuits of exploitation of the memory cells, except for the column decoding amplifiers, are housed on either side of the integrated circuit, at the ends of the memory cell rows.

According to an embodiment of the present invention, all the circuits of exploitation of the memory cells, except for the column decoding amplifiers, are housed on a single side of the integrated circuit, at one end of the memory cell rows.

According to an embodiment of the present invention, all the memory input-output buses are on a same side of the integrated circuit.

According to an embodiment of the present invention, the number of rows of memory cells per memory section is chosen to respect a signal-to-noise ratio in the read mode which is greater than $1/10$ at the input of the column decoding amplifiers.

The foregoing objects, features and advantages of the present invention, will be discussed in detail in the following non-limiting description of specific embodiments in connection with the accompanying drawings.

DETAILED DESCRIPTION

Figure 1:
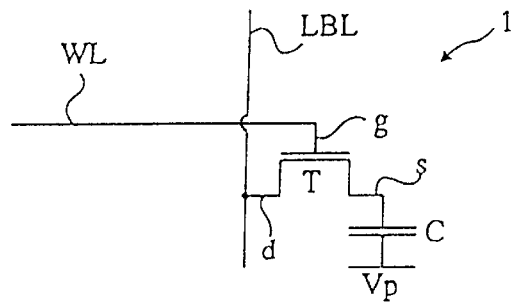
FIGS. 1 to 4, previously described, are meant to show the state of the art and the problem to solve.

The same elements have been referred to with the same references in the different drawings. For clarity, only those elements necessary to the understanding of the present invention have been shown in the drawings and will be described hereafter.

A feature of the present invention is to provide, for each pair of memory sections or planes, associated to be alternately used one by the other as a reference plane, a row of read/write amplifiers, or column decoding amplifiers. Thus, according to the present invention, an integrated circuit DRAM, including several pairs of memory sections associated two by two, includes several rows of column decoding amplifiers and is, however, deprived of section decoders, the amplifiers being implicitly decoded by their respective controls.

The memory planes of an integrated circuit DRAM according to the present invention are, conventionally, formed of cells provided, each, with a transistor associated with a capacitor. Each memory plane includes local bit lines connecting, in a column, the drains of the different transistors, the respective gates of which are connected, in a row, to word lines. The association of the memory cell sections by pairs corresponds, as previously, to a coupling for alternately using one plane or the other as a reference plane.

Figure 5:
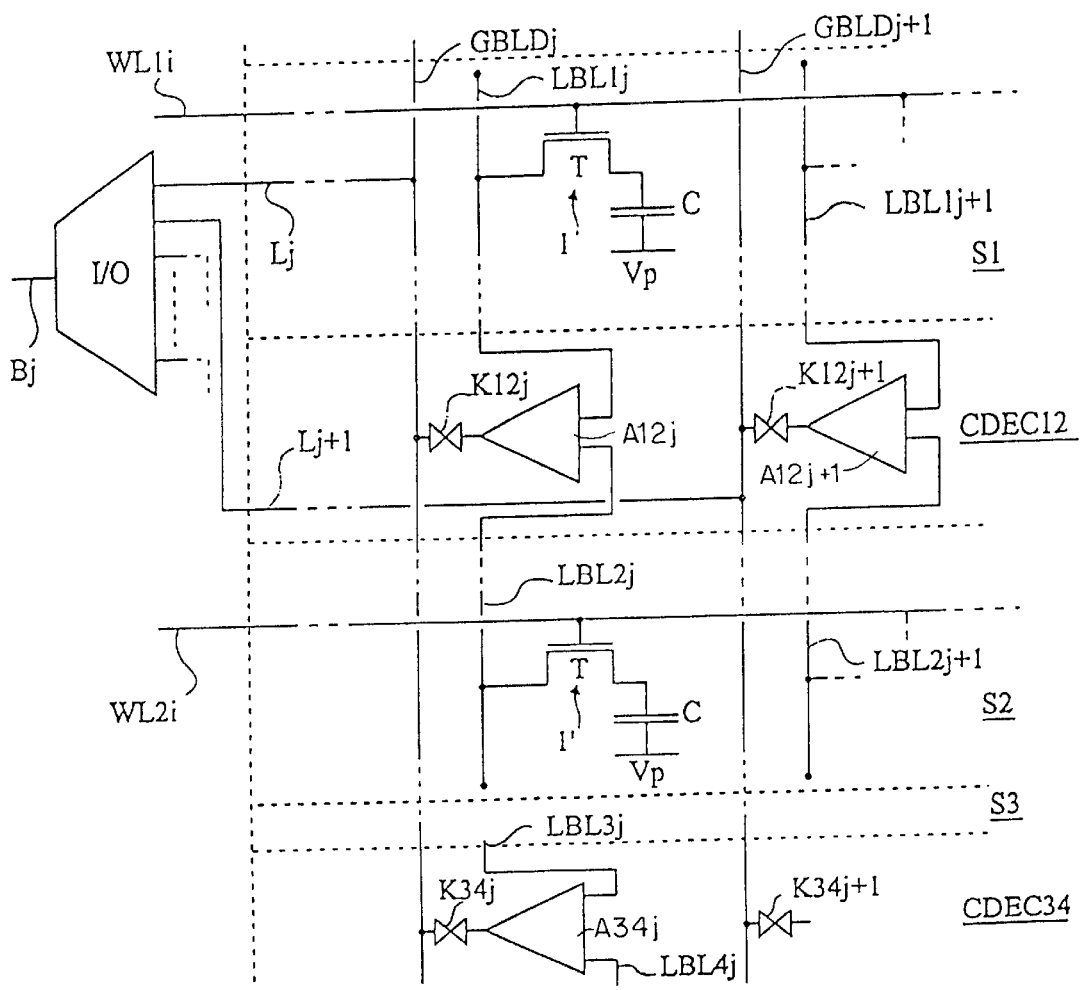
FIG. 5 partially shows an embodiment of a memory array according to the present invention.

FIG. 5 very schematically shows the organization of the read amplifiers of an integrated circuit DRAM according to an embodiment of the present invention.

For clarity reasons, only two memory cells 1, 1' have been detailed in FIG. 5. Similarly, the representation of FIG. 5 is very partial in both array directions. As previously, reference will only be made to read amplifiers but it should be noted that these are read/write amplifiers.

As illustrated in FIG. 5, each local bit line $LBL1_j$, $LBL2_j$, $LBL1_{j+1}$, $LBL2_{j+1}$, $LBL3_j$, $LBL4_j$, is connected to an input of a read or column decoding amplifier $A12_j$, $A12_{j+1}$, $A34_j$. Thus, respective first ends of local bit lines $LBL1_j$ and $LBL2_j$ are connected to two inputs of an amplifier $A12_j$. Lines $LBL1_{j+1}$ and $LBL2_{j+1}$ each have a first end connected to amplifier $A12_{j+1}$. Lines $LBL3_j$ and $LBL4_j$ each have a first end connected to the inputs of an amplifier $A34_j$. This same structure is repeated in the entire array.

Figure 2:
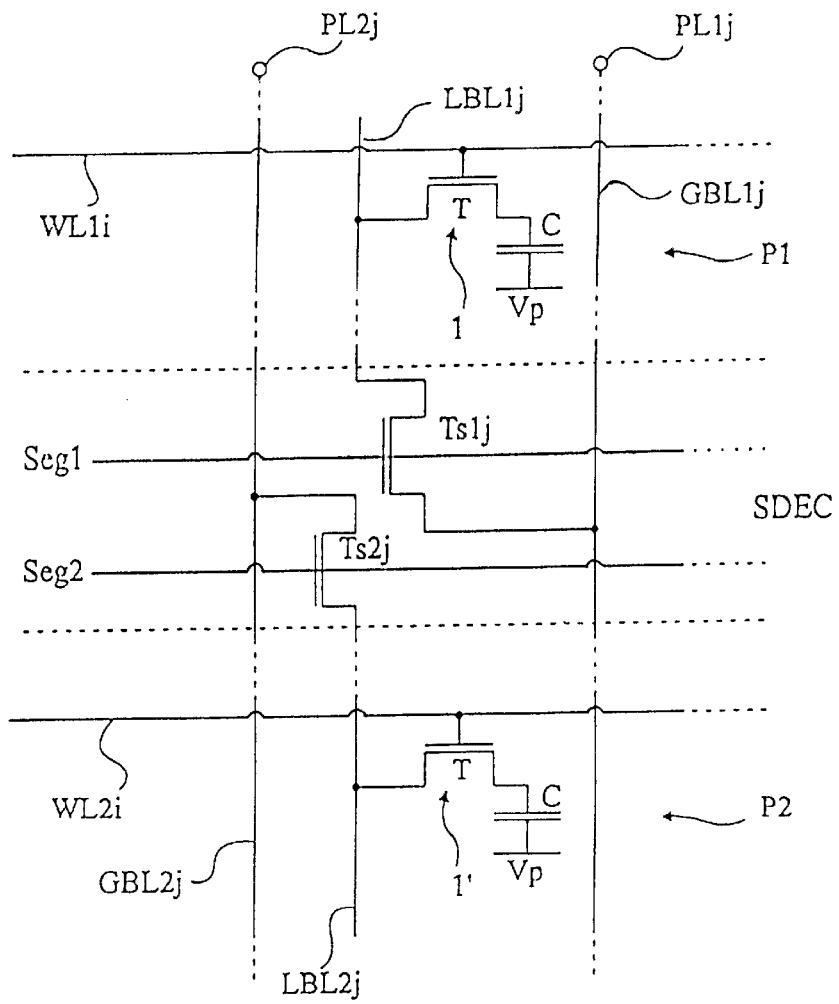

The respective free ends of the different local bit lines are individually connected to a read precharge device (not shown). This device is, conventionally, meant for precharging the bit lines of the memory planes to be read at a voltage Vdd/2, intermediary between the two supply voltages Vdd and Vss of the memory circuit. A distinction between the present invention and the conventional architecture such as described in relation with FIG. 2 is that the local bit lines, and no longer the global bit lines, are connected to the precharge devices.

The present invention avoids the use of global bit lines to carry the data signals before decoding. However, in the memory arrangement, decoded bit lines $GBLD_j$, $GBLD_{j+1}$, which respectively interconnect the respective outputs of the read amplifiers of a same column, are used.

The decoded data signals, present on the decoded bit lines of the present invention, are meant to be connected to the inputs of input-output stages I/O which, conventionally, select one of their inputs to provide a bit $B_j$ of a data word read from the memory.

The fact, according to the present invention, of associating a precharge device with each local bit line enables, without increasing the unity size of memory cells 1, 1', increasing the number of cells connected to a same local bit line and associated with a given read amplifier, while considerably simplifying the structure (the number of transistors) of this read amplifier.

Indeed, the capacitance to be taken into account in the input signal-to-noise ratio of the read amplifiers now is the sole local bit line capacitance and no longer the sum of this capacitance with that of the global bit line. The global bit line capacitance no longer has, according to the present invention, any incidence upon this signal-to-noise ratio since the conductive lines used to form the decoded bit lines of the present invention are used to carry data amplified and decoded by the read amplifiers and which thus are in CMOS levels. Referring to the previously mentioned example of an HCMOS6 technology in which the capacitance of storage capacitors C is on the order of 35 fF, the length of the local bit lines and, thus, the number of memory cells connected thereto, can be increased to reach a capacitance on the order of 300 fF. Such a capacitance provides a signal-to-noise ratio greater than one tenth and already enables considerable simplification of the read amplifiers.

As a specific example of embodiment, by connecting 128 memory cells per local bit line, a local bit line stray capacitance on the order of 280 fF is obtained, to be compared to a 35 fF capacitance. This results in a signal-to-noise ratio on the order of $1/7$. With such a signal-to-noise ratio, it is then possible to design a read amplifier having a number of transistors limited to some ten transistors and, accordingly, the design of which is facilitated and the bulk of which is greatly reduced. The realization of a read amplifier and the influence of the input signal-to-noise ratio upon its complexity is within the abilities of those skilled in the art.

Thus, although the present invention leads to multiplying the number of read amplifiers with respect to a conventional memory, it considerably simplifies them. Further, by eliminating the section decoders required by conventional memories, the vertical size increase due to the use of one row of read amplifiers per pair of memory sections is reduced.

It should be noted that by lengthening the local bit lines, the number of rows of read amplifiers (and thus, of memory sections) is smaller in a memory according to the present invention than in a conventional memory using section decoders.

An advantage of the present invention is that by eliminating the section decoders, the current surge during the memory read precharge is considerably reduced.

Figure 3:
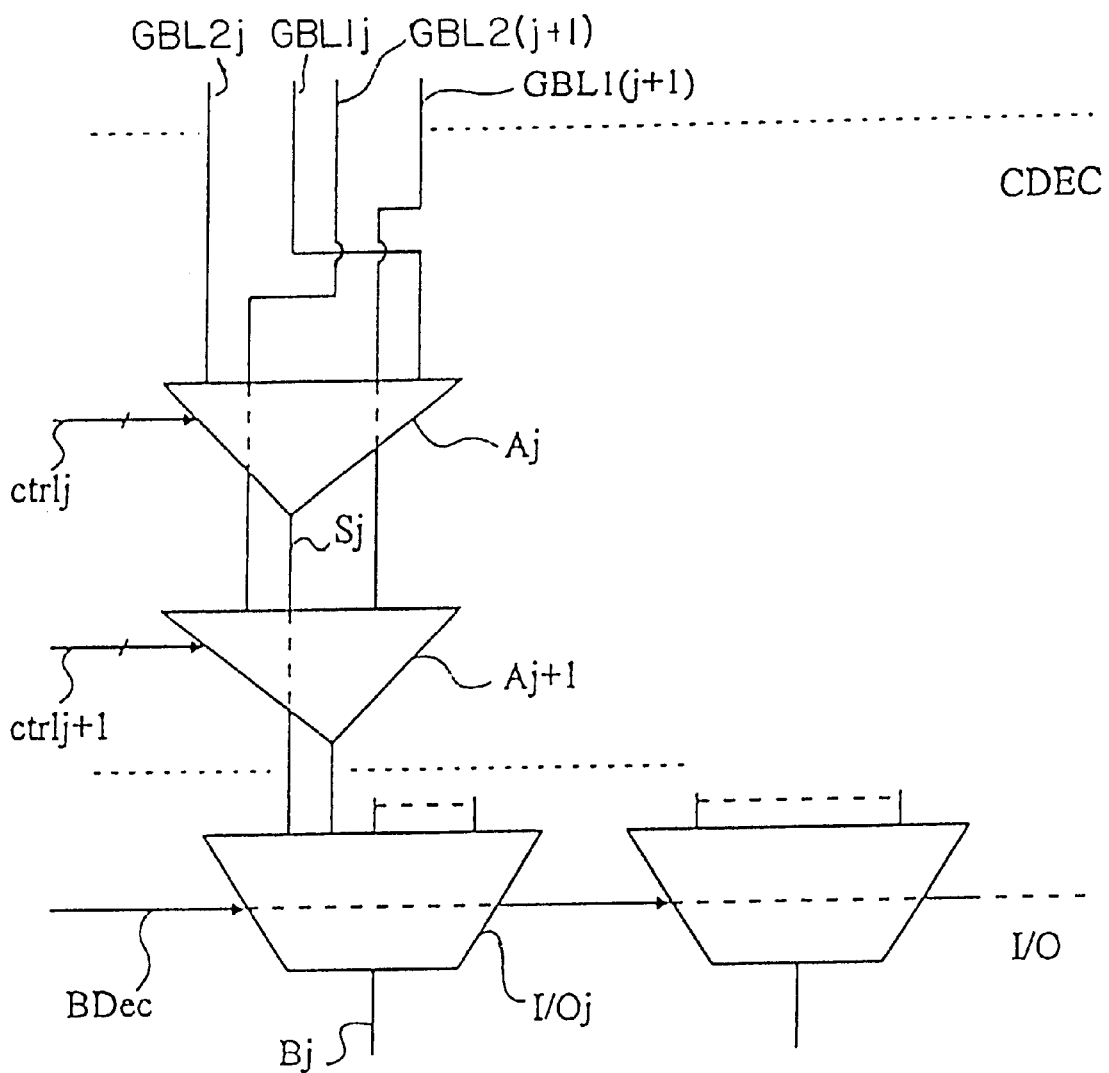
Figure 4:
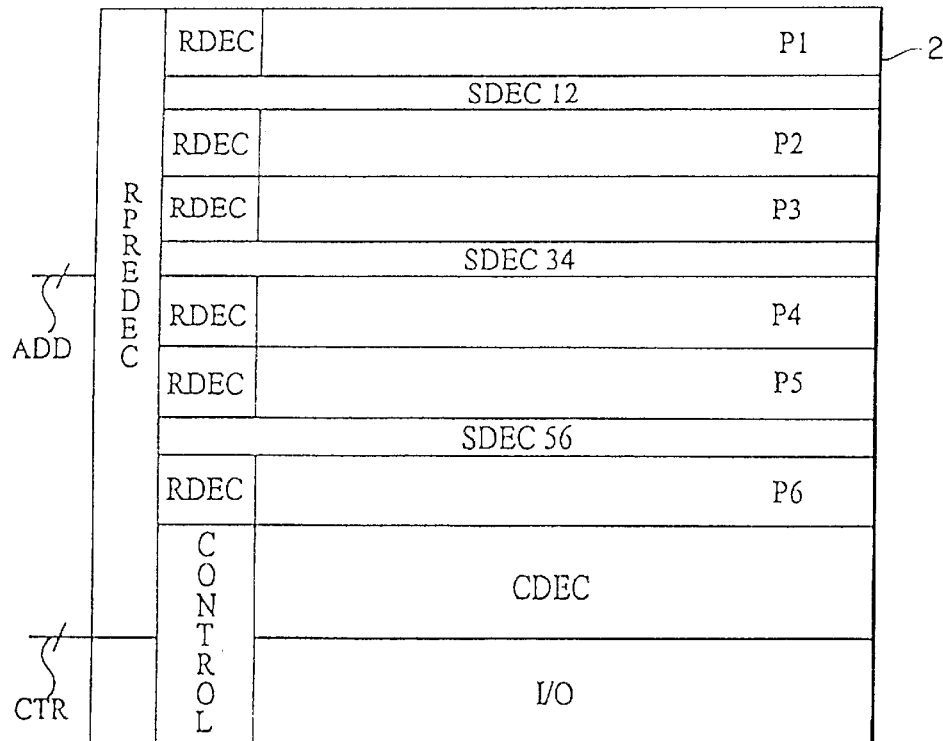

Another advantage of the present invention is that by improving the signal-to-noise ratio of the read amplifier inputs, the individual bulk of a read amplifier is reduced. Now, as seen previously, the read amplifiers distribute in practice in two columns due to their bulk (FIG. 3). Although the bulk reduction provided by the present invention does not enable making an amplifier on a single column since the width of a column is defined based on the individual size of a MOS transistor of the circuit, the present invention reduces or minimizes the height taken up to make a read amplifier.

It should be noted that the architecture of the memory circuit of the present invention absolutely respects the column selection conventionally performed by the input-output stages. In this regard, it should be noted that the number of inputs of each input-output stage is not modified by the implementation of the present invention with respect to a conventional architecture for a given memory. Indeed, while, in a conventional memory, the interconnection of the different memory sections is performed upstream of the read amplifiers, this interconnection is performed, according to the present invention, downstream of these read amplifiers, but remains of the same nature.

Another feature of the present invention is to take advantage of the individual bulk reduction of the read amplifiers and of the elimination of the section decoders to transfer to a single side of the memory all its inputs-outputs.

Figure 6:
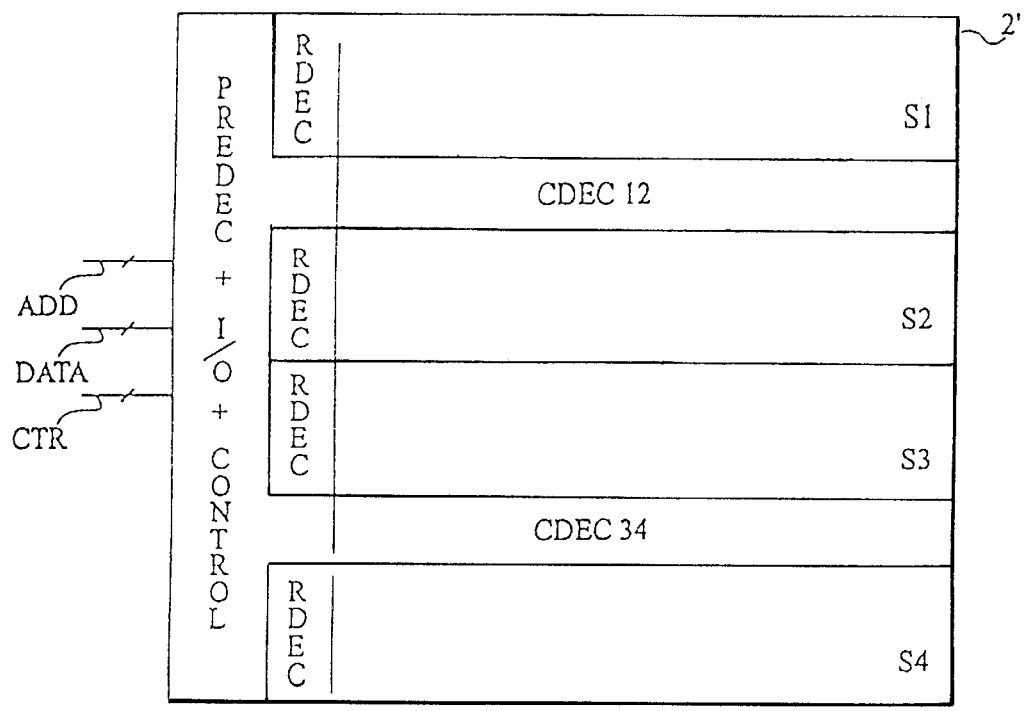
FIG. 6 very schematically shows an embodiment of an integrated circuit DRAM according to the present invention.

FIG. 6 very schematically shows the architecture of an integrated circuit memory according to the present invention. FIG. 6 is a top view of an integrated circuit memory chip 2', made by implementing the present invention. For clarity, it is assumed that the memory taken as an example in FIG. 6 only includes four sections S1, S2, S3, S4, and is associated with two read amplifier (or column decoder) rows CDEC 12 and CDEC34. It should be noted that in practice, the number of read amplifier rows is much larger.

According to the present invention such as illustrated in FIG. 6, the data input-output stages are transferred to the same alignment, preferably on the same side of the memory as the row decoders and the row predecoder. Accordingly, according to the present invention, all addressing, decoding, amplifying and input-output circuits of the memory circuit are on a single side of integrated circuit chip 2', at one end of the rows, that is, of the word lines.

As illustrated in FIG. 5, the decoded bit lines $GBLD_j$, $GBLD_{j+}1$ which interconnect the respective outputs of the read amplifiers are connected, via conductors $L_j$, $L_{j+}1$, to input-output stages I/O. Lines $L_j$ and $L_{j+}1$ are parallel to word lines WL since, according to the present invention, the input-output stages are distributed in the left-hand portion of chip 2'(FIG. 6). In this portion of the chip, all circuits (RDEC, PREDEC, I/O, CONTROL) are arranged so that address bus ADD, data bus DATA and control bus CTR all are on a same side of chip 2'.

A feature of the invention is that the direction change of the bit lines decoded through conductors L that are perpendicular to the lines GBLD is made through a direct conductive interconnection, that is without active elements such as the transistor provided in the decoding amplifiers and in the memory cells.

An advantage of the present invention is that it uses the space left free by row decoders RDEC and their predecoding circuit to house, on the same side of the memory circuit, input-output stages I/O and the general memory control circuits (CONTROL). This is made possible by the housing of read amplifiers CDEC inside the actual memory array.

Thus, an induced advantage of the present invention is that, without increasing the general memory size, or even, while decreasing it, a circuit having all external accesses on the same side is obtained, which considerably simplifies its association with other circuits to make an electronic system.

Another advantage of the present invention is that by transferring all control circuits to a same side of the memory, the general bulk of the memory circuit is reduced.

Another advantage of the present invention is that the "mutual" proximity of all functions shortens the signal propagation times and, accordingly, increases performance.

Further, the fact that the amplifier outputs are interconnected by column causes (as compared to the conventional case of FIG. 3) a decoding of the amplifier outputs upstream of the input-output stages which only receive one wire per column. This considerably reduces the number of wires between the input-output stages and the memory array, which results in a decrease of the number of buffers of the input-output stages, and thus of the surface and consumption.

For example, the decoding of the read amplifier outputs is performed by means of selector switches $K12_j$, $K34_j$, $K12_{j+}1$, $K34_{j+}1$, etc., for example in CMOS technology, respectively associated with the outputs of amplifiers $A12_j$, $A34_j$, $A12_{j+}1$, $A34_{j+}1$, etc. These switches even enable, if desired, to share the same decoded bit line conductor GBLD between several columns, preferably neighboring one another. The number of buffers located at the ends of these wires at the input of the input-output stages is further reduced or minimized. For clarity, the respective control signals of the switches have not been shown.

It should be noted that, to enable an interconnection between decoded bit lines $GBLD_j$, $GBLD_{j+1}$ and the respective lines $L_j$, $L_{j+}1$ of connection to the input-output stages, it is necessary to have, in the multiple-layer integrated circuit in which the memory is formed, a metallization level that enable making lines $L_j$ and $L_{j+}1$ without disturbing the pattern of word lines WL or the respective interconnections between the different memory circuit components.

A first possible solution is to provide a slight increase of the memory circuit plane bulk to guarantee a proper passing of the different conductors.

A second preferred solution is to provide an additional metallization level, to enable making these additional interconnections.

In practice, in an HCMOS6 technology, a metallization level (the fifth level) is available. The implementation of the present invention is then perfectly compatible with conventional methods. In another technology, a dedicated metal level may be added, or an available level (for example, the fifth or the sixth level in HCMOS7 technology) may be used.

Of course, the present invention is likely to have various alterations, modifications, and improvements which will readily occur to those skilled in the art. In particular, the distribution of the different memory control circuits in the lateral portion intended for them depends on the respective sizes of the circuits used, and thus on the application and on the organization of the memory array itself.

Further, although reference has been made in the foregoing description to DRAMs, the present invention applies to any type of array memory organized in memory planes (or sections) formed, each, of an array. In particular, the present invention applies to folded memories, to SRAMs, and to ROMs or EPROMs. Adapting the circuits to implement the present invention is within the abilities of those skilled in the art based on the functional indications given hereabove, provided that a decoded bit line pattern is respected (between the read/write amplifiers and the input-output stages) on two perpendicular conductive (metal) levels. For example, for a folded memory, it may be assumed that two coupled memory cell sections are interleaved so that, for each read amplifier, the two local bit lines correspond to two neighboring lines. A row of read amplifiers is then provided between each pair of interleaved sections.

Further, it should be noted that the present invention also applies to memory cells made based on P-channel transistors. The adaptations are then within the abilities of those skilled in the art and correspond to the conventional adaptations to pass from a circuit for memory cells in N-channel transistors to a circuit for memory cells in P-channel transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit memory including an array of memory cells divided into several sections, and several rows of column decoding amplifiers, the respective outputs of which are interconnected, by column, by means of a decoded bit line, each decoded bit line including a part routed in one of the several rows of column decoding amplifiers to connect each decoded bit line to an input of in input-output stage of the memory arranged at one end of the rows.

2. The memory according to claim 1, wherein the decoded bit line comprises a direct conductive interconnection, without an active element.

3. The memory of claim 1, including one row of column decoding amplifiers for at most two sections.

4. The memory of claim 1, where each memory cell is formed of a transistor associated with a storage capacitor, wherein each column decoding amplifier is directly connected to a local bit line interconnecting one or more of the respective drains of the transistors of the memory cells of a section.

5. The memory of claim 1, wherein all the circuits of exploitation of the memory cells are housed in the same alignment on the integrated circuit.

6. The memory of claim 5, wherein all the circuits of exploitation of the memory cells, except for the column decoding amplifiers, are housed on either side of the integrated circuit, at the ends of the memory cell rows.

7. The memory of claim 5, wherein all the circuits of exploitation of the memory cells, except for the column decoding amplifiers, are housed on a single side of the integrated circuit, at one end of the memory cell rows.

8. The memory of claim 7, wherein all memory input-output buses are on a same side of the integrated circuit.

9. The memory of claim 1, wherein the number of rows of memory cells per memory section is chosen to respect a signal-to-noise ratio in the read mode which is greater than $\frac{1}{10}$ at the input of the column decoding amplifiers.

10. The memory of claim 1, wherein each column decoding amplifier is directly connected to a local bit line interconnecting one or more of the memory cells of a section.

11. The memory of claim 1, wherein the part of the decoded bit line routed in one of the several rows of column decoding amplifiers is routed from the output of a particular column decoding amplifier, in the same row as that particular column decoding amplifier, to connect the decoded bit line to the input of the input-output stage of the memory arranged at one end of the rows.

12. An integrated circuit memory comprising:
an array of memory cells divided into at least two sections;
at least one row of column decoding amplifiers;
the respective outputs of the column decoding amplifiers being interconnected by column with a decoded bit line;
the decoded bit line being routed to an end of the section of memory cells in one of the at least one row of column decoding amplifiers.

13. The memory according to claim 12 wherein the at least one row of column decoding amplifiers is located between sections of memory cells.

14. The memory according to claim 12, wherein the decoded bit line comprises a direct conductive interconnection, without an active element.

15. The memory of claim 12, including one row of column decoding amplifiers for at most two sections.

16. The memory of claim 12, wherein each memory cell is formed of a transistor associated with a storage capacitor, wherein each column decoding amplifier is directly connected to a local bit line interconnecting the respective drains of the transistors of one or more of the memory cells of a section.

17. The memory of claim 12, wherein all the circuits of exploitation of the memory cells are housed in the same alignment on the integrated circuit.

18. The memory of claim 17, wherein all the circuits of exploitation of the memory cells, except for the column decoding amplifiers, are housed on either side of the integrated circuit, at the ends of the sections of memory cells.

19. The memory of claim 17, wherein all the circuits of exploitation of the memory cells, except for the column decoding amplifiers, are housed on a single side of the integrated circuit, at one end of the sections of memory cells.

20. The memory of claim 19, wherein all memory input-output buses are on a same side of the integrated circuit.

21. The memory of claim 12, wherein the number of rows of memory cells per memory section is chosen to respect a signal-to-noise ratio in the read mode which is greater than $\frac{1}{10}$ at the input of the column decoding amplifiers.

22. The memory of claim 12, wherein each column decoding amplifier is directly connected to a local bit line interconnecting one or more of the memory cells of a section.

23. An integrated circuit memory comprising:
   an array of memory cells divided into at least two sections;
   at least one row of column decoding amplifiers located between sections of memory cells;
   the respective outputs of the column decoding amplifiers being connected by column with a decoded bit line.

24. The memory of claim 23, wherein each column decoding amplifier is directly connected to at least one local bit line interconnecting the memory cells of a section.

25. The memory of claim 23, wherein each memory cell is formed of a transistor associated with a storage capacitor, and wherein each column decoding amplifier is directly connected to at least one local bit line interconnecting the respective drains of the transistors of the memory cells of a section.

* * * * *